United States Patent
Lee et al.

(10) Patent No.: US 8,637,919 B2
(45) Date of Patent: Jan. 28, 2014

(54) NONVOLATILE MEMORY DEVICE

(75) Inventors: Ki-Hong Lee, Gyeonggi-do (KR); Kwon Hong, Gyeonggi-do (KR); Beom-yong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/310,329

(22) Filed: Dec. 2, 2011

(65) Prior Publication Data

US 2012/0168850 A1    Jul. 5, 2012

(30) Foreign Application Priority Data

Dec. 31, 2010   (KR) .......................... 10-2010-0140459

(51) Int. Cl.
*H01L 29/792*   (2006.01)
*H01L 21/336*   (2006.01)

(52) U.S. Cl.
USPC ......................................... 257/324; 438/257

(58) Field of Classification Search
CPC .. H01L 27/115; H01L 29/792; H01L 29/7827
USPC ........... 257/324, E29.309, E29.262; 438/131, 438/132, 157, 201, 257
See application file for complete search history.

(56) References Cited

U.S. PATENT DOCUMENTS

| | | | |
|---|---|---|---|
| 2008/0017914 A1* | 1/2008 | Natori et al. .................. | 257/315 |
| 2010/0144133 A1* | 6/2010 | Nomura et al. ................ | 438/586 |
| 2010/0178755 A1* | 7/2010 | Lee et al. ...................... | 438/479 |
| 2010/0237400 A1* | 9/2010 | Aoyama ....................... | 257/324 |

* cited by examiner

*Primary Examiner* — Nikolay Yushin
(74) *Attorney, Agent, or Firm* — IP & T Group LLP

(57) ABSTRACT

A nonvolatile memory device includes a channel protruding in a vertical direction from a substrate, a plurality of interlayer dielectric layers and gate electrode layers which are alternately stacked over the substrate along the channel, and a memory layer formed between the channel and a stacked structure of the interlayer dielectric layers and gate electrode layers. Two or more gate electrode layers of the plurality of gate electrode layers are coupled to an interconnection line to form a selection transistor.

14 Claims, 11 Drawing Sheets

NONVOLATILE MEMORY DEVICE

CROSS-REFERENCE TO RELATED APPLICATIONS

The present application claims priority of Korean Patent Application No. 10-2010-0140459, filed on Dec. 31, 2010, which is incorporated herein by reference in its entirety.

BACKGROUND

1. Field

Exemplary embodiments of the present invention relate to a nonvolatile memory device and a method for fabricating the same, and more particularly, to a nonvolatile memory device having memory cells vertically-stacked on a substrate and a method for fabricating the same.

2. Description of the Related Art

A nonvolatile memory device is a memory device which is capable of maintaining data stored therein without a power supply. A variety of nonvolatile memory devices such as a flash memory device, are widely being used.

As higher integration of a two-dimensional (2D) memory device having a single layer of memory cells formed on a silicon substrate is reaching physical limits, a three-dimensional (3D) nonvolatile memory device having a plurality of memory cells vertically-stacked on a silicon substrate is being developed.

FIG. 1 is a cross-sectional view of a conventional 3D nonvolatile memory device.

Referring to FIG. 1, the conventional 3D nonvolatile memory device includes a plurality of memory cells (MC) vertically stacked on a substrate, and the memory cells MC are coupled in series between selection transistors LST and UST to form one memory cell string. That is, the selection transistors LST and UST are disposed at the bottom and top of the memory cells MC, respectively.

The lower selection transistor LST includes a lowermost gate electrode layer of a plurality of gate electrode layers 120, a memory layer 130, and a channel layer 140. The upper selection transistor UST includes an uppermost gate electrode layer of the plurality of gate electrode layers 120, the memory layer 130, and the channel layer 140. The plurality of memory cells MC includes the memory layer 130, the channel layer 140, and the plurality of gate electrode layer 120 other than the lowermost and uppermost gate electrode layers, respectively.

Such a 3D nonvolatile memory device may be formed by the series of following processes. First, a plurality of interlayer dielectric layers 110 and gate electrode layers 120 are alternately stacked over the substrate 100. The stacked structure is selectively etched to form a plurality of trenches to expose the substrate 100. The memory layer 130 is formed on sidewalls of each trench, and the trench having the memory layer 130 formed therein is filled with the channel layer 140.

Meanwhile, each of the gate electrode layers 120 may be coupled to a corresponding interconnection line, for example, a source selection line, a drain selection line, a word line, or the like. For this structure, a contact which is not illustrated may be formed on the gate electrode layer 120. In order to secure such a contact formation region, an etching process called a slimming process is performed on the stacked structure of the interlayer dielectric layers 110 and the gate electrode layers 120. When the slimming process is performed, a side portion of the stacked structure of the interlayer dielectric layers 110 and the gate electrode layers 120 is formed in a stepped shape as a whole. Therefore, each of the gate electrode layers 120 is extended more than the one positioned immediately above. Contacts may be formed on the protruding ends of the gate electrode layers 120.

However, the conventional 3D nonvolatile memory device may have the following features.

As illustrated in FIG. 1, the gate electrode layer 120 of the upper selection transistors UST or the gate electrode layer 120 of the lower selection transistors LST has a larger thickness than the gate electrode layer 120 of each memory cell MC. In the 3D structure, the thickness of the gate electrode layer 120 corresponds to the gate length of a transistor. Therefore, in order to enhance an off-leakage current characteristic, the thickness of the gate electrode layers 120 of the upper and lower selection transistors LST and UST is increased.

In such a case, however, since the gate electrode layers 120 of the upper and lower selection transistors LST and UST and the gate electrodes 120 of the memory cells MC are to be deposited by different deposition equipments, the deposition process may be complicated and the process time may increase.

Furthermore, since it is relatively difficult to etch the gate electrode layers 120 of the lower and upper selection transistors LST and UST having a large thickness during the slimming process, a variety of errors may occur in the etching process. In order to prevent such an occurrence of etching defects, the etching process is to be performed by using an additional mask. This may make the entire process complex.

Nevertheless, when the thickness of the gate electrode layers 120 of the lower and upper selection transistors LST and UST is reduced, the above-described off-leakage current characteristic may decrease.

SUMMARY

An embodiment of the present invention is directed to a nonvolatile memory device and a method for fabricating the same, which is capable of satisfying desired electrical characteristics, simplifying the process, and preventing errors from occurring in the process.

In accordance with an embodiment of the present invention, a nonvolatile memory device includes: a channel protruding in a vertical direction from a substrate; a plurality of interlayer dielectric layers and gate electrode layers which are alternately stacked over the substrate along the channel; and a memory layer formed between the channel and a stacked structure of the interlayer dielectric layers and gate electrode layers. Two or more gate electrode layers of the plurality of gate electrode layers may be coupled to an interconnection line to form a selection transistor.

In accordance with another embodiment of the present invention, a method for fabricating a nonvolatile memory device includes alternately stacking a plurality of interlayer dielectric layers and gate electrode layers over a substrate; selectively etching the plurality of interlayer dielectric layers and gate electrode layers to form a channel hole exposing the substrate; forming a memory layer on sidewalls of the channel hole; and forming a channel in the channel hole. Two or more gate electrode layers of the plurality of gate electrode layers may be coupled to an interconnection line to form a selection transistor.

In accordance with further embodiment of the present invention, a method for fabricating a nonvolatile memory device includes alternately stacking a plurality of interlayer dielectric layers and a plurality of sacrifice layers over a substrate; selectively etching the plurality of interlayer dielectric layers and the plurality of sacrifice layers to form a plurality of channel holes exposing the substrate; forming a channel in the channel holes; forming a slit to isolate the plurality of sacrifice layers between the channel holes; removing the plurality of sacrifice layers exposed by the slit; and forming a memory layer and gate electrode layers in spaces from which the plurality of sacrifice layers are removed, wherein two or more gate electrode layers of the plurality of gate electrode layers are coupled to an interconnection line to form a selection transistor.

DETAILED DESCRIPTION

Figure 1:
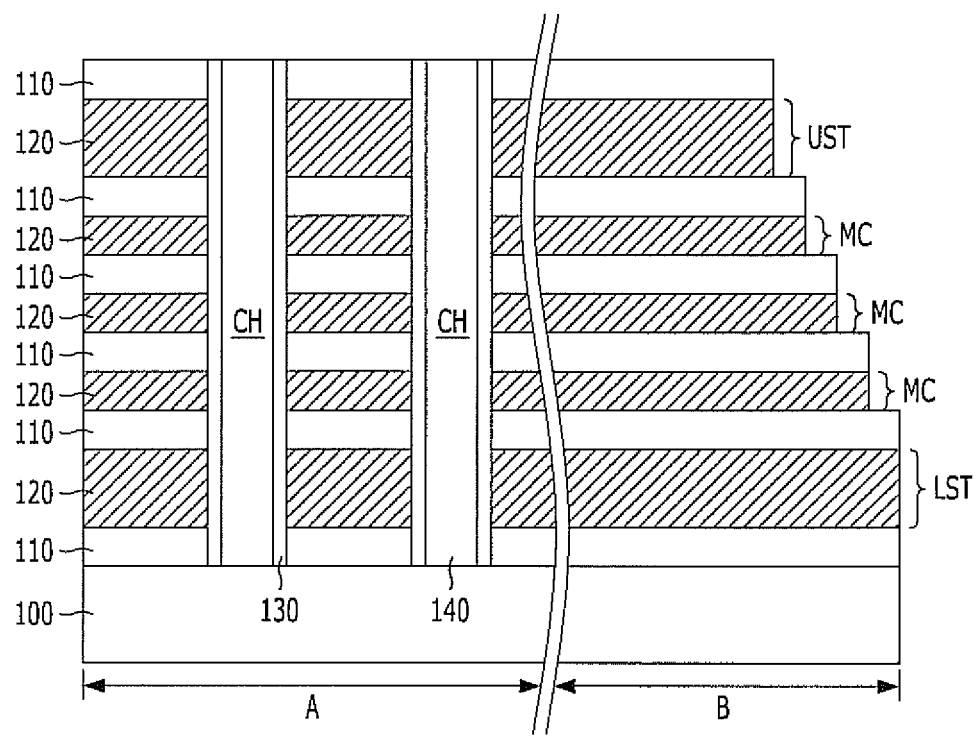
FIG. 1 is a cross-sectional view of a conventional 3D nonvolatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
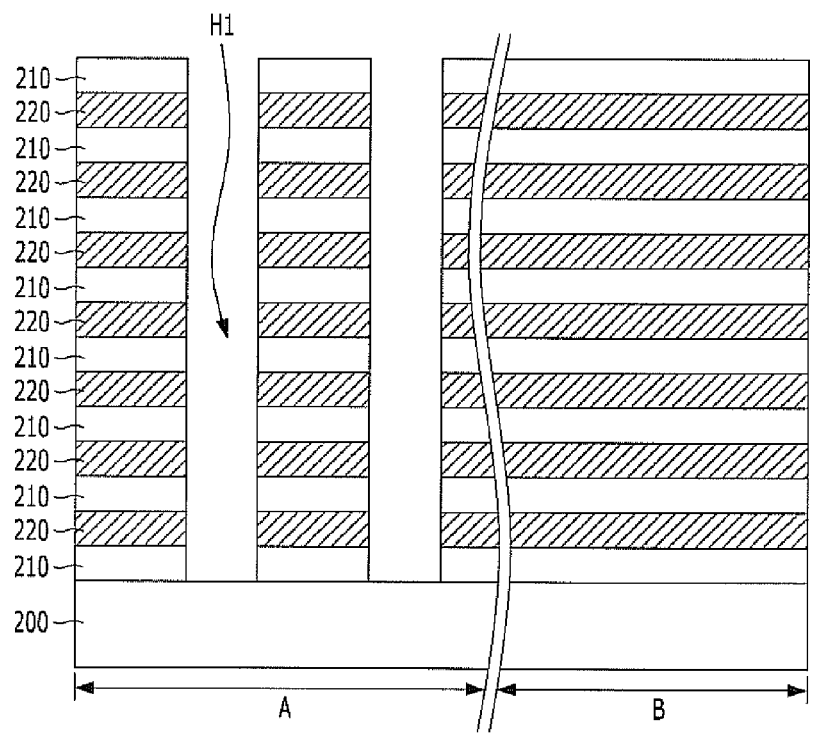
FIGS. 2A to 2G are diagrams illustrating a 3D nonvolatile memory device and a method for fabricating the same in accordance with a first embodiment of the present invention.
Figure 2B:
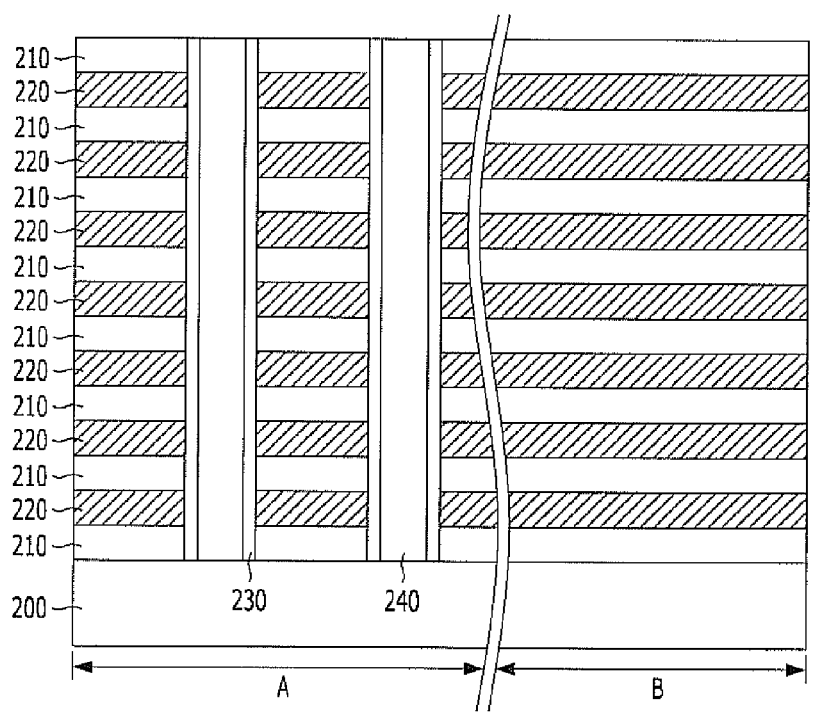
Figure 2C:
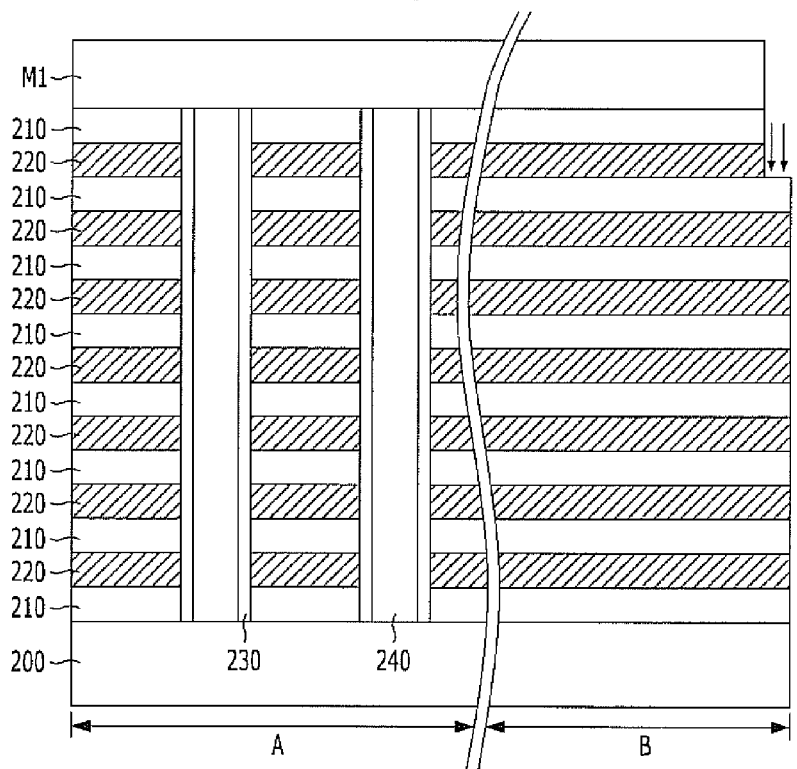
Figure 2D:
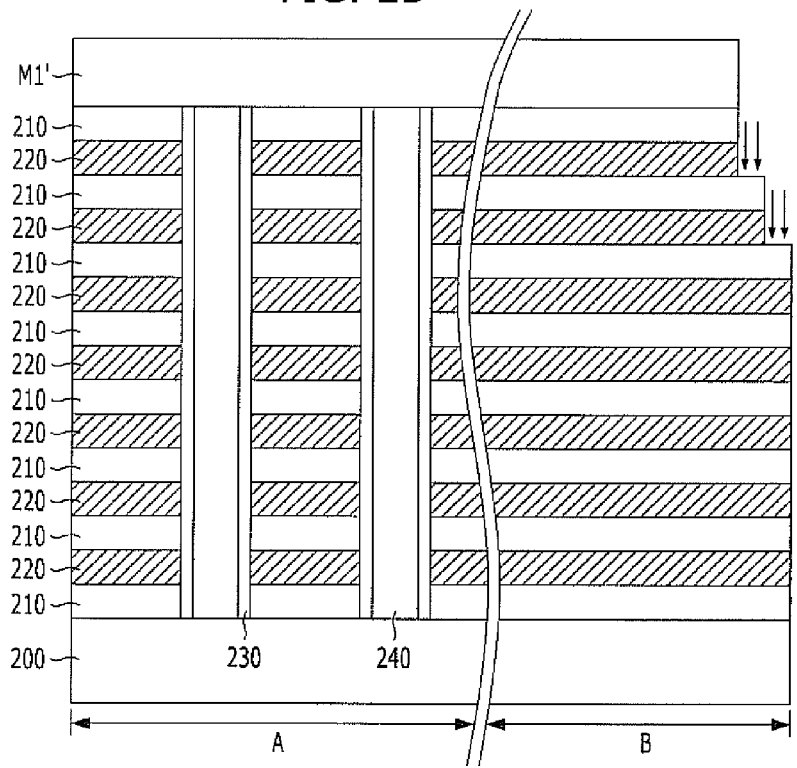
Figure 2E:
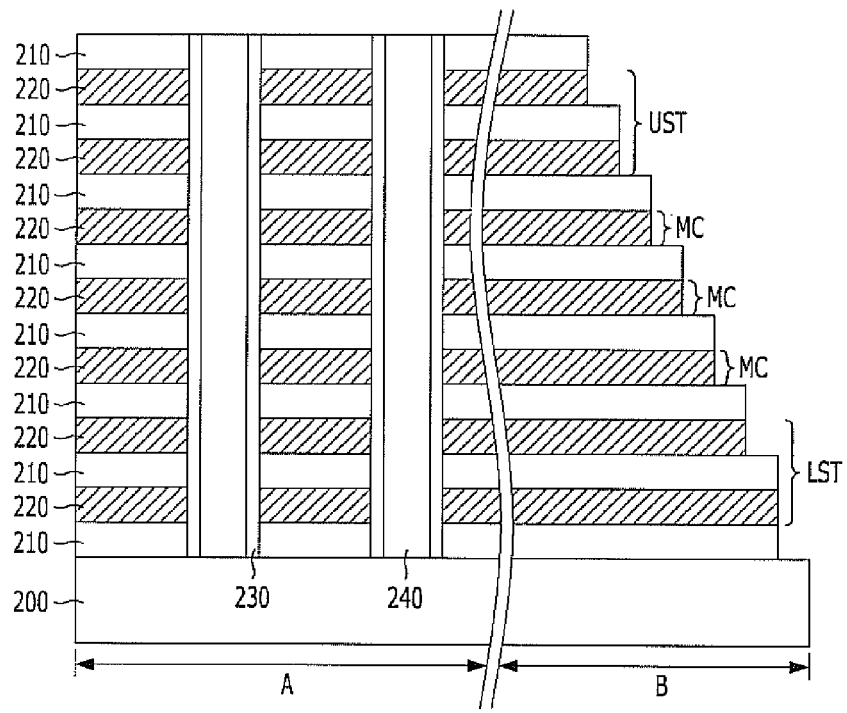
Figure 2F:
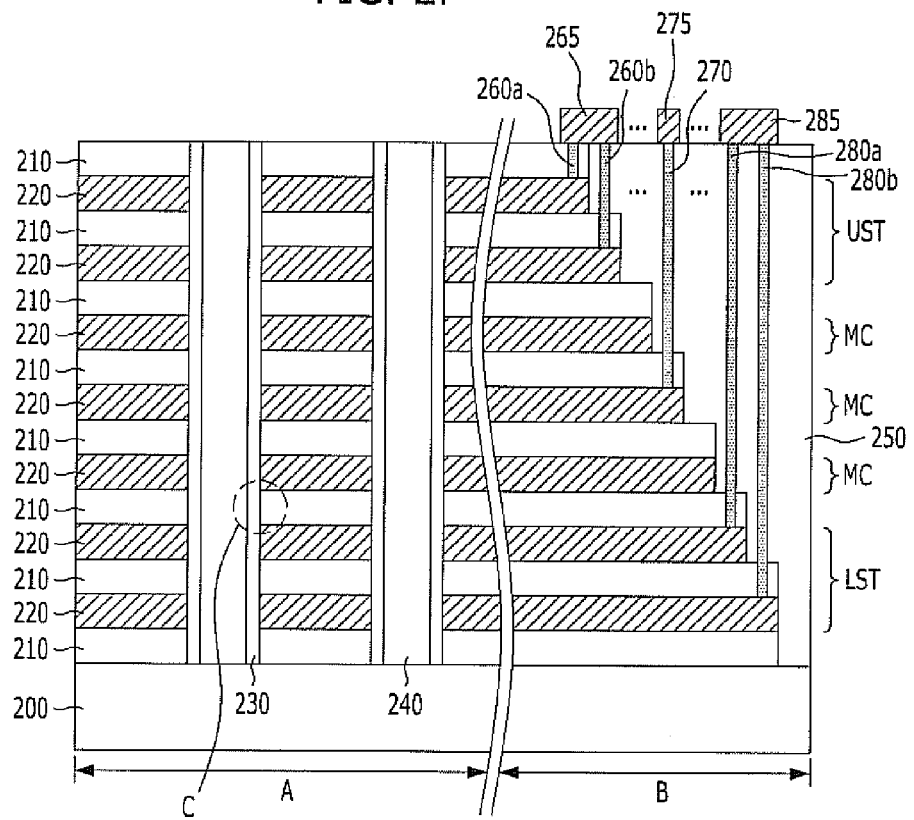
Figure 2G:
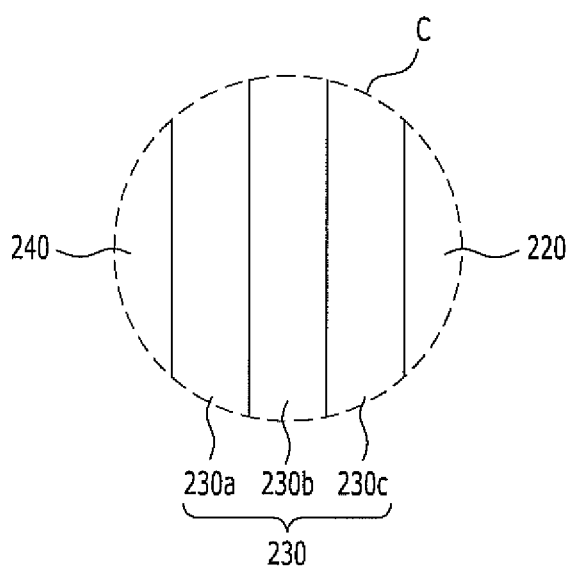

FIGS. 2A to 2G are diagrams illustrating a 3D nonvolatile memory device and a method for fabricating the same in accordance with a first embodiment of the present invention. Specifically, FIG. 2F is a cross-sectional view of the nonvolatile memory device in accordance with the first embodiment of the present invention. FIGS. 2A to 2E are cross-sectional views illustrating intermediate steps for fabricating the device of FIG. 2F. FIG. 2G illustrates a portion C of FIG. 2F in detail.

In the cross-sectionals views, a memory cell region A and a contact formation region B are illustrated, respectively. In the memory cell region A, channels are disposed to form memory cells. In the contact formation region B, contacts coupled to gate electrode layers, respectively, are disposed in order to couple the gate electrode layers to corresponding interconnections.

Referring to FIG. 2F, the 3D nonvolatile memory device in accordance with the embodiment of the present invention will be described.

Referring to FIG. 2F, a structure in which a plurality of first interlayer dielectric layers 210 and gate electrode layers 220 are alternately stacked is disposed on a substrate 200 having a lower structure formed therein, such as a source line and so on. The lower structure is not illustrated in FIG. 2F. Here, the first interlayer dielectric layers 210 serve to insulate a plurality of memory cells MC from each other or insulate the memory cells MC from selection transistors UST and LST positioned over and under the memory cells MC. The first interlayer dielectric layers 210 may include an oxide layer, for example. Furthermore, the gate electrode layers 220 are provided to form gate electrodes of the respective memory cells MC and the upper and lower selection transistors UST and LST and may include an impurity-doped polysilicon layer.

In the memory cell region A, a channel layer 240 and a memory layer 230 are disposed. The channel layer 240 protrudes in a vertical direction from the substrate 200 and passes through the stacked structure of the first interlayer dielectric layers 210 and the gate electrode layers 220. The memory layer 230 is interposed between the channel layer 240 and the stacked structure of the first interlayer dielectric layers 210 and the gate electrode layers 220.

Referring to FIG. 2G, the memory layer 230 may include a tunnel insulation layer 230a, a charge trap layer 230b, and a charge blocking layer 230c. The tunnel insulation layer 230a is disposed in the side of the channel layer 240 to enable tunneling of electric charges and may include an oxide layer, for example. The charge trap layer 230b serves to trap the tunneling electric charges and may include a nitride layer, for example. The charge blocking layer 230c serves to block the charge transfer between the gate electrode layer 220 and the charge trap layer 230b and may include an oxide layer, for example. The memory layer 230 of each memory cell MC serves to trap electric charges to store data and functions as a gate dielectric layer, and the memory layers 230 of the upper and lower selection transistors UST and LST simply function as gate dielectric layers.

The channel layer 240 may include an impurity-doped polysilicon layer, for example. The channel layer 240 may be used as channels of the memory cells MC and the upper and lower selection transistors UST and LST.

In the contact formation region B, the stacked structure of the first interlayer dielectric layers 210 and the gate electrode layers 220 have a side portion formed in a stepped shape as a whole. More specifically, each of the gate electrode layers 220 horizontally extended more than the one positioned immediately thereover. Such a structure may provide an area in which a contact coupled to a gate electrode layer 220 is to be disposed.

Here, the respective gate electrode layers 220 may substantially have the same thickness. Furthermore, the respective first interlayer dielectric layers 210 may substantially have the same thickness.

Among the plurality of gate electrode layers 220, two gate electrode layers 220 disposed at the uppermost portion may be used as gate electrode layers 220 of the upper selection transistor UST. For this structure, two contacts 260a and 260b disposed on the protruding end portions of the two gate electrode layers 220 of the upper selection transistor UST may be coupled to a first interconnection line 265, for example, a drain selection line. Hereafter, for illustration purposes, the two contacts 260a and 260b coupled to the first interconnection line 265 are referred to as first contacts 260a and 260b.

Among the plurality of gate electrode layers 220, two gate electrode layers 220 disposed at the lowermost portion may be used as gate electrode layers 220 of the lower selection transistor LST. For this structure, two contacts 280a and 280b disposed on the protruding end portions of the two gate electrode layers 220 of the lower selection transistor LST may be coupled to a second interconnection line 285, for example, a source selection line. Hereafter, for illustration purposes, the two contacts 280a and 280b coupled to the second interconnection line 285 are referred to as second contacts 280a and 280b.

The other gate electrode layers 220 excluding the gate electrode layers 220 of the upper and lower selection transistors UST and LST may be used as gate electrode layers 220 of the respective memory cells MC. A contact 270 disposed on a protruding end of the gate electrode layer 220 of each memory cell MC may be coupled to a third interconnection line 275, for example, a word line. FIG. 2F illustrates one contact 270, for illustration purposes, but a plurality of contacts may be disposed on the protruding end portions of the gate electrode layers 220 of the respective memory cells MC. Hereafter, for illustration purposes, the contacts disposed on the protruding end portions of the gate electrode layers 220 of the respective memory cells MC are referred to as third contacts 270.

In FIG. 2F, reference numeral 250 represents a second interlayer dielectric layer, and the first to third contacts 260a, 260b, 270, 280a, and 280b may be coupled to the protruding end portions of the gate electrode layers 220, respectively, by passing through the second interlayer dielectric layer 250 and/or the first interlayer dielectric layer 210. The first to third interconnection lines 265, 275, and 285 are disposed on the second interlayer dielectric layer 250 and coupled to the corresponding contacts, respectively.

In this embodiment, it has been described that the upper and lower selection transistors UST and LST include two gate electrode layers 220. However, the embodiment of the present invention is not limited to the structure. For example, three or more gate electrode layers 220 disposed at the uppermost portion may be used as gate electrode layers 220 of the upper selection transistor UST. In this case, contacts disposed on end portions of the three or more gate electrode layers 220 may be coupled to the first interconnection line 265 together. Furthermore, three or more gate electrode layers 220 disposed at the lowermost portion may be used as gate electrode layers 220 of the lower selection transistor LST. In this case, contacts disposed on end portions of the three or more gate electrode layers 220 may be coupled to the second interconnection line 285 together.

In short, the upper selection transistor UST may include two or more gate electrode layers 220 disposed at the uppermost portion among the plurality of gate electrode layers 220, the memory layer 230, and the channel layer 240. Furthermore, the lower selection transistor LST may include two or more gate electrode layers 220 disposed at the lowermost portion among the plurality of gate electrode layers 220, the memory layer 230, and the channel layer 240. Furthermore, the memory cells MC may include the respective gate electrode layers 220, excluding the gate electrode layers 220 of the upper and lower selection transistors UST and LST, the memory layer 230, and the channel layer 240.

In the above-described nonvolatile memory device in accordance with the first embodiment of the present invention, two or more gate electrode layers 220 are used as the gate electrode layers 220 of the lower or upper selection transistor LST or UST. Therefore, an effective channel length of a gate may be increased. Accordingly, although the plurality of gate electrode layers 220 substantially have the same thickness, an off-leakage current characteristic may be prevented from being degraded.

Furthermore, since the plurality of gate dielectric layers 220 substantially have the same thickness, a process defect does not occur, and the process may be simplified. This will be described in more detail while a fabrication method is described as follows.

Referring to FIGS. 2A to 2F, a method for fabricating the nonvolatile memory device in accordance with the first embodiment of the present invention will be described.

Referring to FIG. 2A, a plurality of first interlayer dielectric layers 210 and gate electrode layers 220 are alternately stacked over a substrate 200. The stacked structure of the first interlayer dielectric layers 210 and the gate electrode layers 220 in the memory cell region A is selectively etched to form a channel hole H1 which passes through the stacked structure and exposes the substrate 200.

The plurality of gate electrode layers 220 substantially have the same thickness. Accordingly, the deposition process of the gate electrode layers 220 may be performed by the same deposition equipment and may be simplified as a result.

Referring to FIG. 2B, a memory layer 230 is formed on sidewalls of the channel hole H1, and a channel layer 240 is buried in the channel hole H1 having the memory layer 230 formed thereon.

The memory layer 230 may be formed by the following process: a tunnel insulation layer 230a, a charge trap layer 230b, and a charge blocking layer 230c (refer to FIG. 2G) are sequentially deposited on the resultant structure including the channel hole H1, and a blanket etching process is performed to form the memory layer 230.

The channel layer 240 may be formed by the following process. First, a material for the channel layer 240 is deposited on the resultant structure having the memory layer 230 formed thereon to have such a thickness as to sufficiently fill the channel hole H1. Then, a planarization process is performed to expose the first interlayer dielectric layer 210 positioned at the uppermost portion.

Referring to FIG. 2E, a slimming process is performed on the stacked structure of the first interlayer dielectric layers 210 and the gate dielectric layers 220 in the contact formation region B such that the stacked structure of the first interlayer dielectric layers 210 and the gate dielectric layers 220 have a side portion formed in a stepped shape as a whole.

Referring to FIGS. 2C to 2D, the slimming process will be described in detail as follows.

Referring to FIG. 2C, a primary mask pattern M1 is formed on the resultant structure of FIG. 2B. The primary mask pattern M1 covers the memory cell region A and partially expose the contact formation region B. At this time, the primary mask pattern M1 may be formed to expose a side portion of the contact formation region B by a predetermined width.

Next, the first interlayer dielectric layer 210 and the gate electrode layer 220 which are positioned at the uppermost portion are etched by using the primary mask pattern M1 as an etching barrier.

Referring to FIG. 2D, the width of the primary mask pattern M1 is reduced to form a secondary mask pattern M1'. The reduced width may correspond to the width of a protruding end portion of the gate electrode layer 220 positioned at the lowermost portion in FIG. 2E.

Next, the first interlayer dielectric layer 210 and the gate electrode layer 220 which are positioned at the uppermost portion are etched by using the secondary mask pattern M1' as an etching barrier. During this process, the first interlayer dielectric layer 210 and the gate electrode layer 220 which are disposed immediately under the uppermost layers are etched together in the stepped shape.

In this way, while the width of the primary mask pattern M1 is gradually reduced, the etching process of the first interlayer dielectric layer 210 and the gate electrode layer 220 is repetitively performed. As a result, a step-shaped structure as illustrated in FIG. 2E may be obtained.

As described above, the respective gate electrode layers 220 substantially have the same thickness. Therefore, since one mask is used to perform the slimming process, the process is easy to perform, thereby preventing the occurrence of an etching defect.

Referring to FIG. 2F, a second interlayer dielectric layer 250 is formed over the resultant structure of FIG. 2E. Then, the second interlayer dielectric layer 250 and/or the first interlayer dielectric layers 210 of the contact formation region B are selectively etched to form a plurality of contact holes which expose the protruding end portions of the respective gate electrode layers 220. The contact holes are filled with a conductive material to form first to third contacts 260a, 260b, 270, 280a, and 280b.

A conductive layer is formed on the second interlayer dielectric layer 250 and then patterned to form a first interconnection line 265 coupled to both of the first contacts 260a and 260b, a second interconnection line 285 coupled to both of the second contacts 280a and 280b, and a third interconnection line 275 coupled to the third contact 270.

Meanwhile, the above-described features of the exemplary embodiment of the present invention may be applied to nonvolatile memory devices having various kinds of 3D structures. This will be described as follows, while simplifying or omitting the descriptions similar to those of the above-described nonvolatile memory device in accordance with the first embodiment of the present invention.

FIGS. 3A to 3E are diagrams illustrating a 3D nonvolatile memory device and a method for fabricating the same in accordance with a second embodiment of the present invention.

Figure 3A:
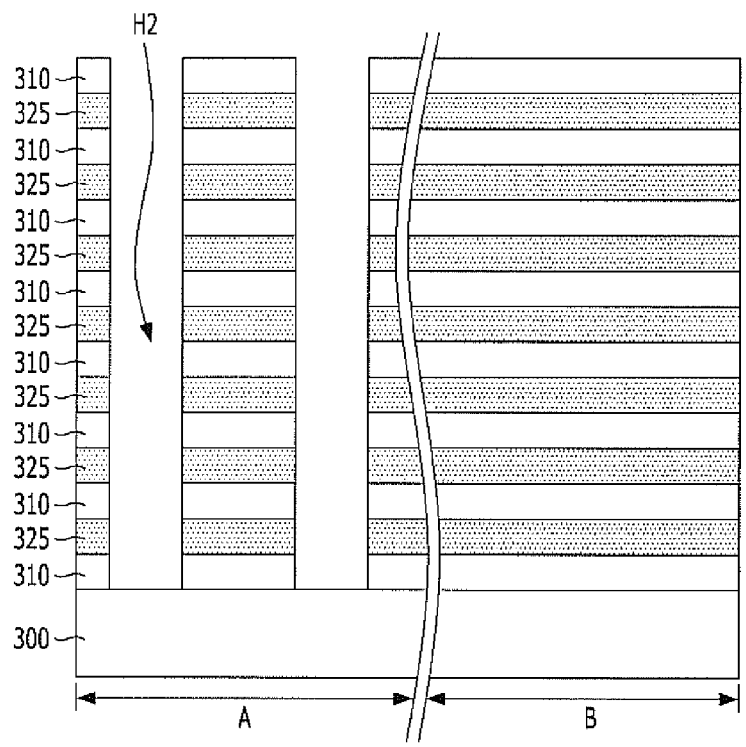
FIGS. 3A to 3E are diagrams illustrating a 3D nonvolatile memory device and a method for fabricating the same in accordance with a second embodiment of the present invention.

Referring to FIG. 3A, a plurality of first interlayer dielectric layers 310 and sacrifice layers 325 are alternately stacked over a substrate 300. The stacked structure of the first interlayer dielectric layers 310 and the sacrifice layers 325 in a memory cell region A is selectively etched to form a plurality of channel holes H2 exposing the substrate 300 by passing through the stacked structure.

The respective sacrifice layers 325, which are to be replaced with gate electrode layers by a subsequent process, substantially have the same thickness. The sacrifice layers 325 may be formed of an insulator such as oxide or nitride.

Figure 3B:
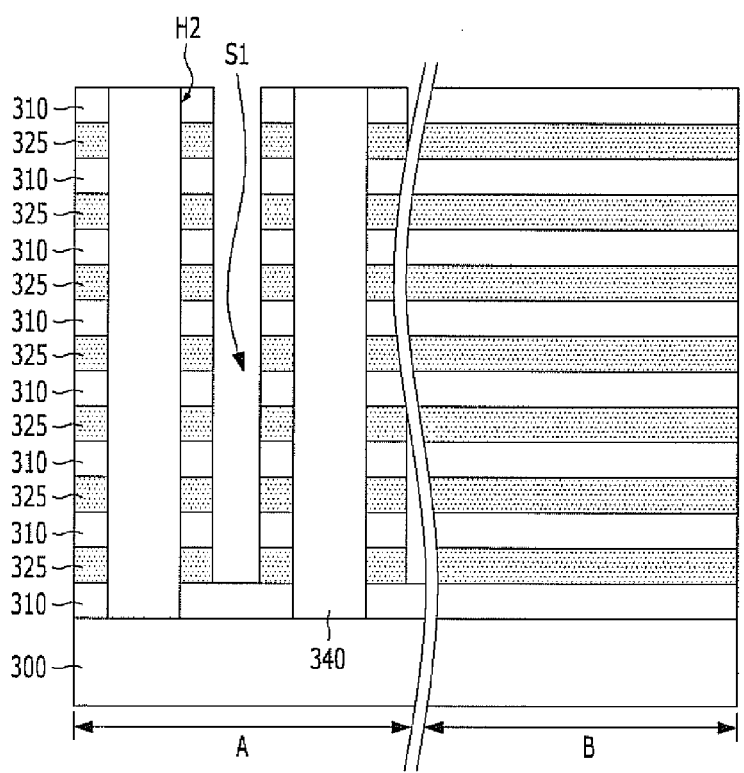

Referring to FIG. 3B, a channel layer 340 is formed to be buried in the channel holes H2.

The stacked structure of the first interlayer dielectric layers 310 and the sacrifice layers 325 between the channel layers 340 is selectively etched to form a slit S1. The slit S1, as an extended shape in one direction, isolates the first interlayer dielectric layers 310 and the sacrifice layers 325, respectively, between the channel layers 340 while exposing the sidewalls of the first interlayer dielectric layers 310 and the sacrifice layers 325. At this time, when the etching process for forming the slit S1 is performed, the first interlayer dielectric layer 310 positioned at the lowermost portion is used as an etching stop layer.

Such a slit S1 may be formed in the contact formation region B as well as the memory cell region A. However, the drawings illustrate the cross-section of the contact formation region B, which is parallel to the extension direction of the slit S1, in order to describe a step-shaped structure which is to be formed by a subsequent process. Therefore, the slit S1 is not indicated in the contact formation region B.

Figure 3C:
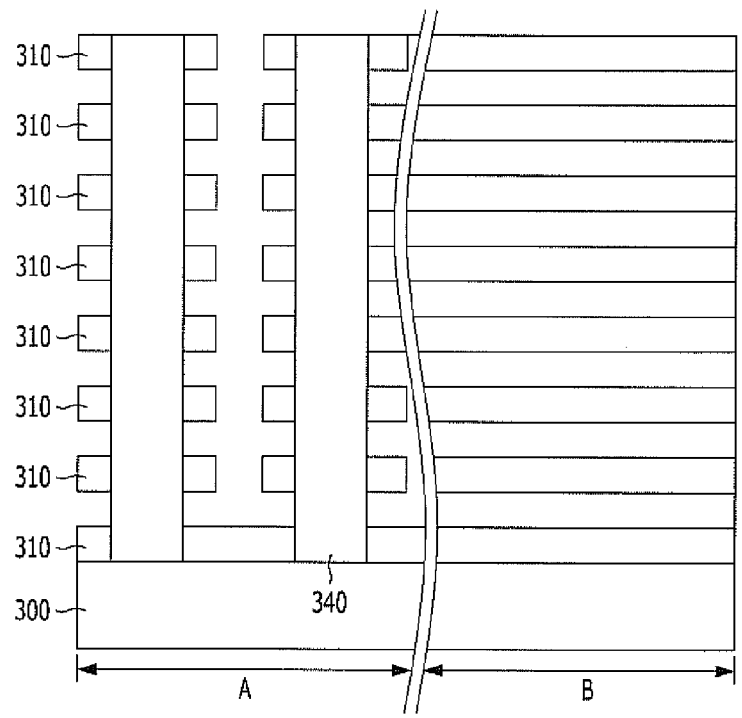

Referring to FIG. 3C, the sacrifice layers 325 exposed by the slit S1 are removed. As a result, spaces which expose the channel layer 340 between the respective first interlayer dielectric layers 310 are formed.

Figure 3D:
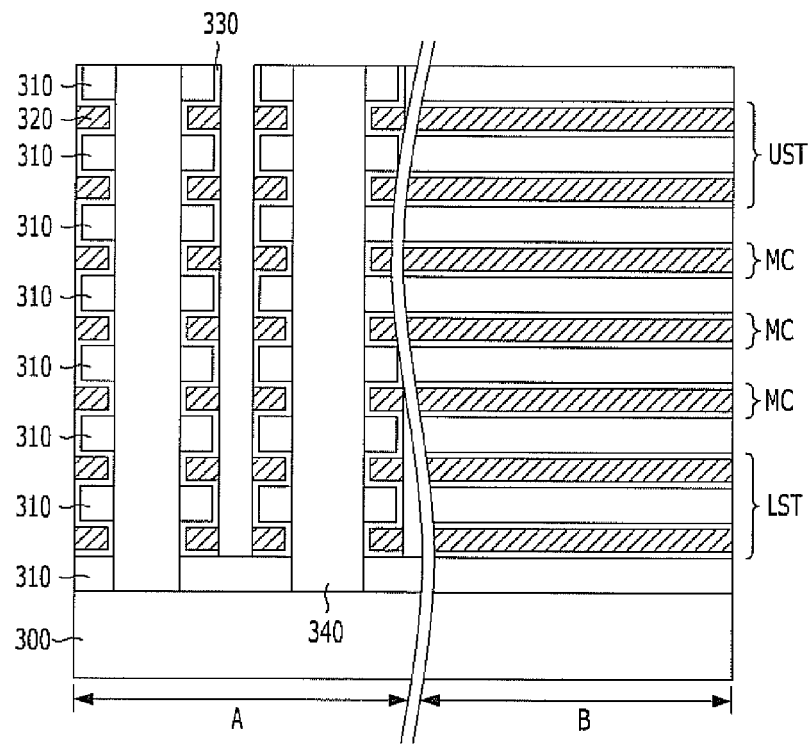

Referring to FIG. 3D, a memory layer 330 is formed along the surface of the resultant structure from which the sacrifice layers 325 were removed, that is, the surfaces of the first interlayer dielectric layers 310 and the channel layer 340.

A gate electrode layer 320 is buried in the respective spaces between the first interlayer dielectric layers 310 where the memory layer 330 is formed. More specifically, a conductive material is deposited on the memory layer 330 to have such a thickness as to sufficiently fill the spaces between the first interlayer dielectric layers, and then an etch back process is performed on the deposited material to expose the first interlayer dielectric layer 310 at the bottom surface of the slit S1, thereby forming the gate electrode layers 320. Here, the etch back process may be performed by using wet etching, dry etching, or a combination thereof.

As a result of the process of FIG. 3D, a stacked structure of a lower selection transistor LST, a plurality of memory cells MC, and an upper selection transistor UST may be formed. As described above, the lower selection transistor LST may include two or more gate electrode layers 320 disposed at the lowermost portion among the plurality of gate electrode layers 320, the memory layer 330, and the channel layer 340. Furthermore, the upper selection transistor UST may include two or more gate electrode layers 320 disposed at the uppermost portion among the plurality of gate electrode layers 320, the memory layer 330, and the channel layer 340. The memory cells MC may include the respective gate electrode layers 320, excluding the gate electrode layers 320 of the upper and lower selection transistor UST and LST, the memory layer 330, and the channel layer 340.

Figure 3E:
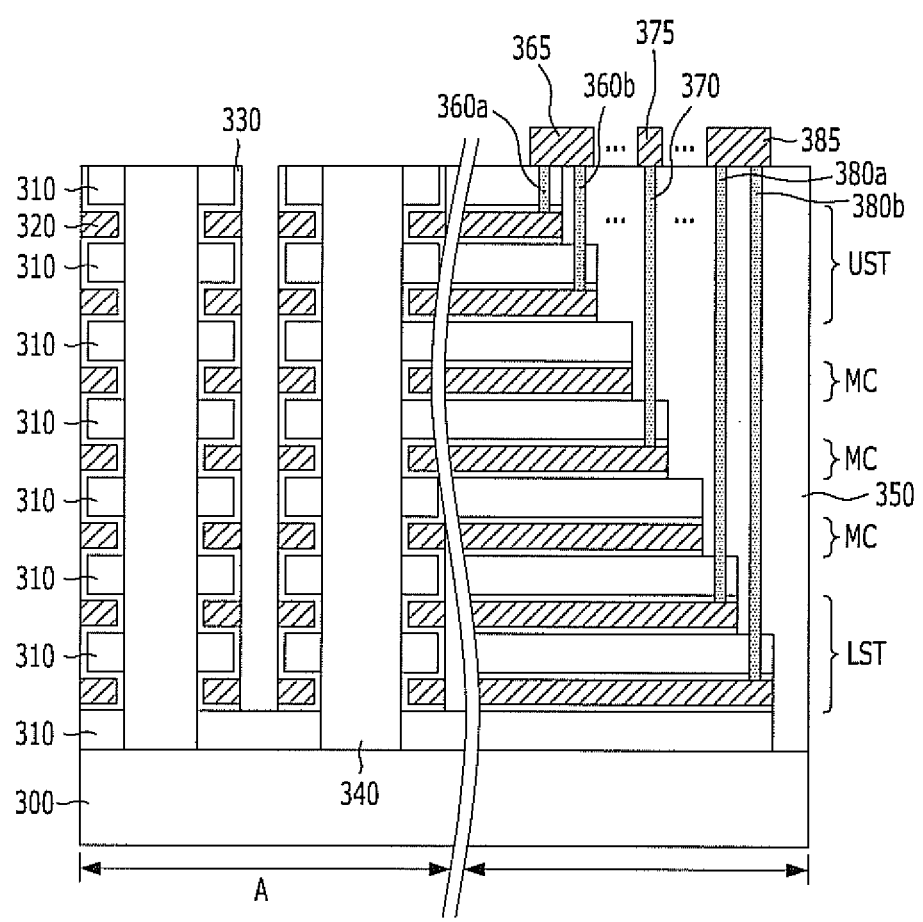

Referring to FIG. 3E, a slimming process is performed on the stacked structure of the first interlayer dielectric layers 310 and the gate electrode layers 320 in the contact formation region B such that the stacked structure of the first interlayer dielectric layers 310 and the gate electrode layers 320 has a side portion formed in a stepped shape as a whole. The slimming process has been already described above.

A second interlayer dielectric layer 350 is formed, and first to third contacts 360a, 360b, 380a, 380b, and 370 are formed to be coupled to the protruding end portions of the respective gate electrode layers 320 by passing through the second interlayer dielectric layer 350, the first interlayer dielectric layers 310, and/or the memory layer 330. More specifically, the first contacts 360a and 360b are disposed on the protruding end portions of two gate electrode layers 320 included in the upper selection transistor UST, the third contact 370 is disposed on the protruding end portion of the gate electrode 320 included in each of the memory cells MC, and the second contacts 380a and 380b are disposed on the protruding end portions of two gate electrode layers 320 included in the lower selection transistor LST.

First to third interconnection lines 365, 385, and 375 are formed on the second interlayer dielectric layer 350. The first interconnection line 365 is coupled to both of the first contacts 360a and 360b, the second interconnection line 385 is coupled to both of the second contacts 380a and 380b, and the third interconnection line 375 is coupled to the third contact 370.

Through the above-described fabrication method, a nonvolatile memory device may be formed to have a structure illustrated in FIG. 3E.

In short, the nonvolatile memory device and the method for fabricating the same in accordance with the second embodiment of the present invention are substantially the same as the nonvolatile memory device and the method for fabricating the same in accordance with the first embodiment of the present invention, except that the gate electrode layers 320 are formed by replacing sacrifice layers 325 and thus the memory layer 330 is also interposed between the first interlayer dielectric layer 310 and the gate electrode layer 320.

Therefore, in accordance with the second embodiment of the present invention, the nonvolatile memory device may have features that are the same as those of the first embodiment of the present invention.

Furthermore, as the respective sacrifice layers 325 are formed to have the same thickness, it may substantially prevent a defect occurring in the conventional nonvolatile memory device. Specifically, in the conventional nonvolatile memory device, the gate electrode of the selection transistor has a large thickness, and thus the thickness of the sacrifice layer for the gate electrode becomes large as well. Therefore, when a conductive material for gate electrodes is buried in the area from which the sacrifice layer has removed, the conductive material may not be completely buried in the region. Therefore, when the conductive material for gate electrodes is etched back as a subsequent process, most of the conductive material may be lost in the selection transistor region. In this embodiment of the present invention, however, since the respective sacrifice layers 325 substantially have the same thickness, such a feature of the conventional nonvolatile memory device may be addressed.

FIGS. 4A to 4E are diagrams illustrating a 3D nonvolatile memory device and a method for fabricating the same in accordance with a third embodiment of the present invention. In particular, the 3D nonvolatile memory device in accordance with the third embodiment of the present invention is characterized in that a U-shaped memory cell string is formed and a selection transistor is disposed over only memory cells and not under the memory cells.

Figure 4A:
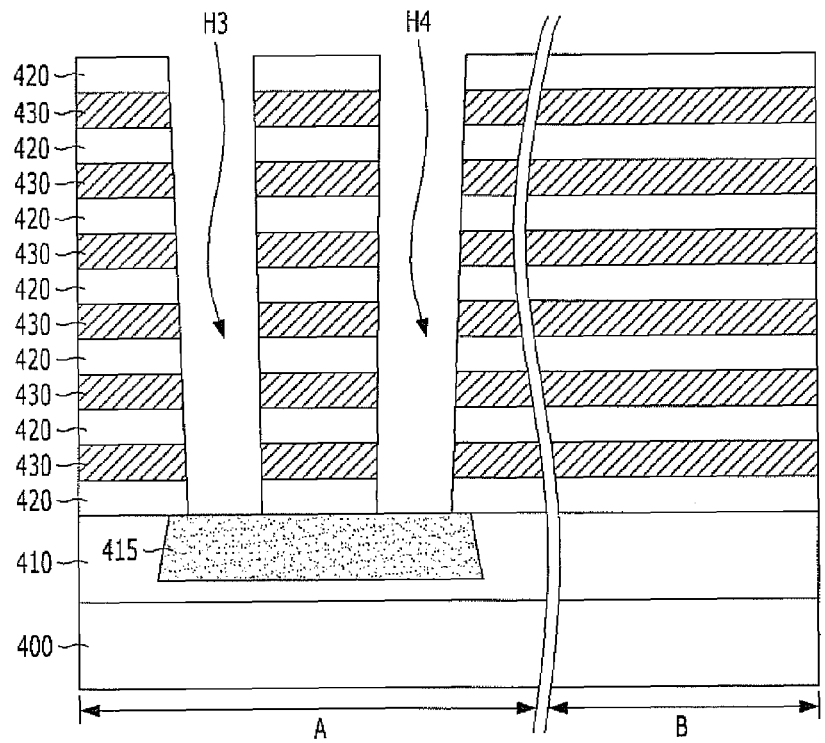
FIGS. 4A to 4E are diagrams illustrating a 3D nonvolatile memory device and a method for fabricating the same in accordance with a third embodiment of the present invention.

Referring to FIG. 4A, a pipe gate electrode layer 410 is formed on a substrate 400. A sacrifice layer 415 for forming a pipe channel is buried in the pipe gate electrode layer 410 of a memory cell region A. The sacrifice layer 415 may include an insulator such as oxide or nitride.

A plurality of first interlayer dielectric layers 420 and gate electrode layers 430 are alternately stacked on the pipe gate electrode layer 410 having the sacrifice layer 415 buried therein. The stacked structure of the first interlayer dielectric layers 420 and the gate electrode layers 430 in the memory cell region A is selectively etched to form a pair of channel holes H3 and H4 exposing the sacrifice layer 415 by passing through the stacked structure.

Figure 4B:
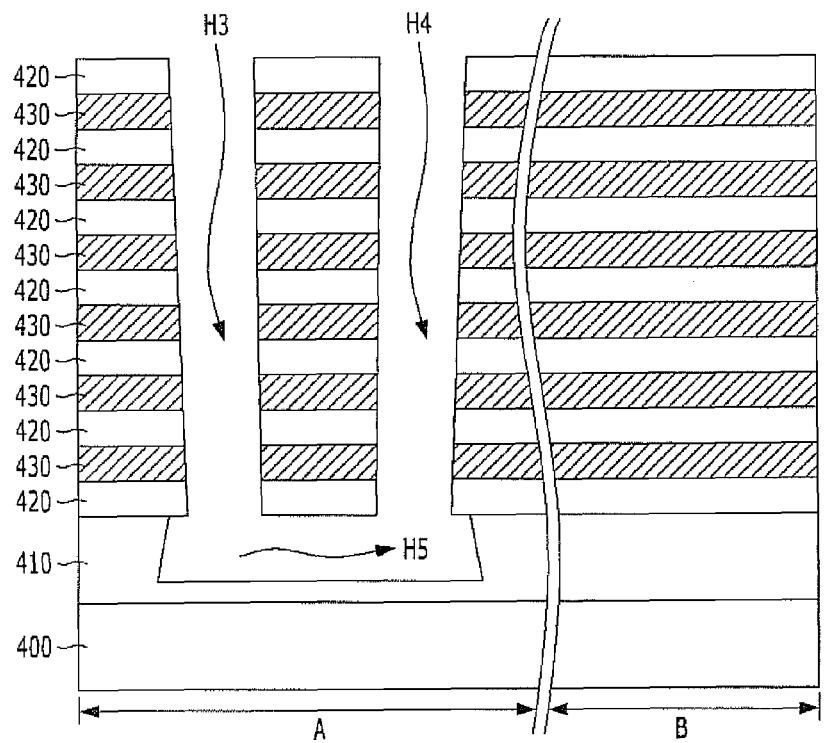

Referring to FIG. 4B, the sacrifice layer 415 exposed by the channel holes H3 and H4 is removed. The removal of the sacrifice layer 415 may be performed by a wet etching process, for example.

As a result of the process of FIG. 4B, a pipe channel hole H5 is formed under the pair of channel holes H3 and H4 so as to couple the channel holes H3 and H4. Thus, the pair of channel holes H3 and H4 and the pipe channel hole H5 form a U-shaped hole as a whole.

Figure 4C:
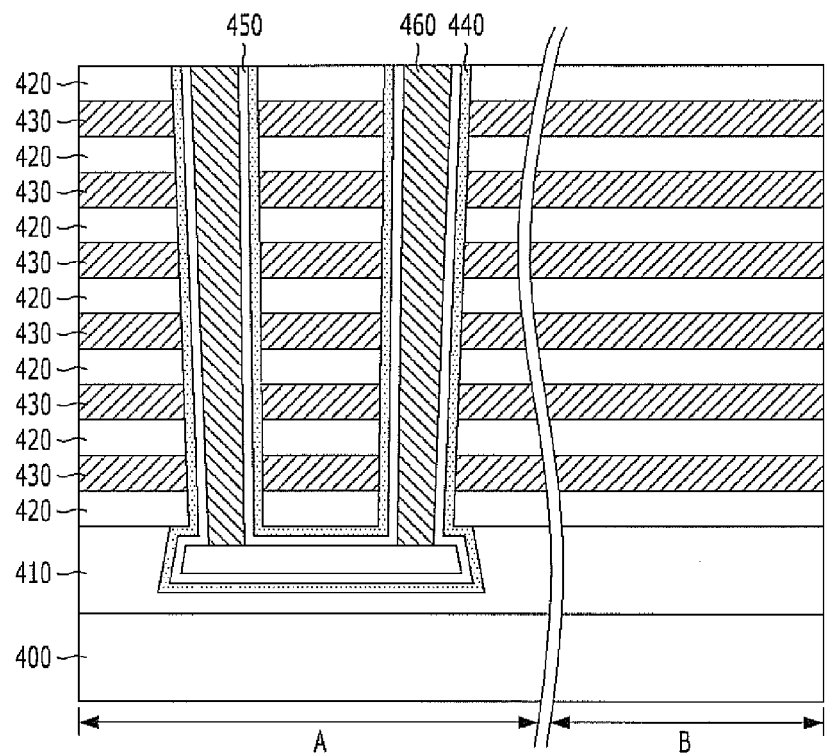

Referring to FIG. 4C, a memory layer 440 and a channel layer 450 are formed along the inner walls of the pair of channel holes H3 and H4 and the pipe channel hole H5, and the remaining space is filled with a first insulator 460. At this time, due to the characteristics of the process, the first insulator 460 may not completely fill the pipe channel hole H5, and thus a cavity may exist in the pipe channel hole H5.

Figure 4D:
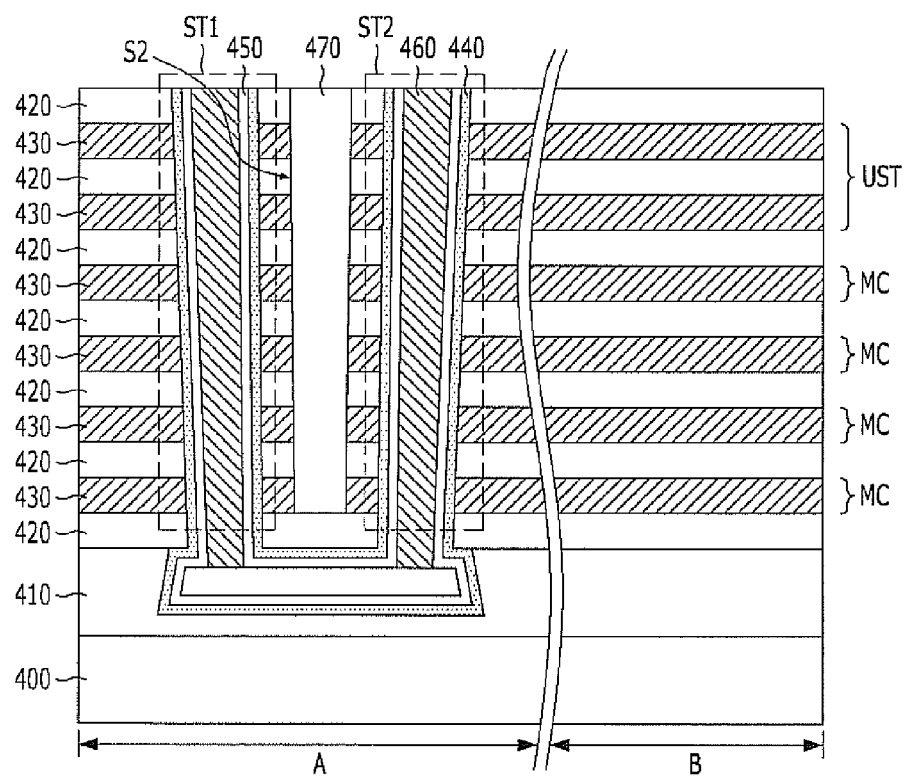

Referring to FIG. 4D, the stacked structure of the first interlayer dielectric layers 420 and the gate electrode layers 430 between the pair of channel holes H3 and H4 is selectively etched to form a slit S2. The slit S2 is extended in one direction, while isolating the plurality of gate electrode layers 430 between the pair of channel holes H3 and H4. At this time, when the etching process for forming the slit S2 is performed, the first interlayer dielectric layer 420 positioned at the lowermost portion serves as an etching stop layer.

A second insulator 470 is buried in the slit S2.

As a result of the process of FIG. 4D, a plurality of memory cells MC and an upper selection transistor UST positioned over the memory cells MC are formed. The plurality of memory cells MC and the upper selection transistor UST include the memory layer 440 and the channel layer 450 formed along the inner walls of the channel holes H3 and H4 and the gate electrode layers 430 which are stacked along the memory layer 440 and the channel layer 450. Here, the plurality of memory cells MC and the upper selection transistor UST, which are stacked along the channel hole H3, and the plurality of memory cells MC and the upper selection transistor UST, which are stacked along the channel hole H4, are isolated by the insulator 470 buried in the slit S2, thereby forming a pair of first and second vertical strings ST1 and ST2. The first and second vertical strings ST1 and ST2 are coupled to each other by a pipe transistor including the memory layer 440 and the channel layer 450, which are formed on the inner wall of the pipe channel hole H5, and the pipe gate electrode layer 410 surrounding the memory layer 440 and the channel layer 450. The first vertical string ST1, the second vertical string ST2, and the pipe transistor form one U-shaped memory cell string.

As described above, the upper selection transistor UST may include two or more gate electrode layers 430 positioned at the uppermost portion among the plurality of gate electrode layers 430, the memory layer 440, and the channel layer 450. The memory cells MC may include the respective gate electrode layers, excluding the gate electrode layers 430 of the upper selection transistor UST, the memory layer 440, and the channel layer 450.

Figure 4E:
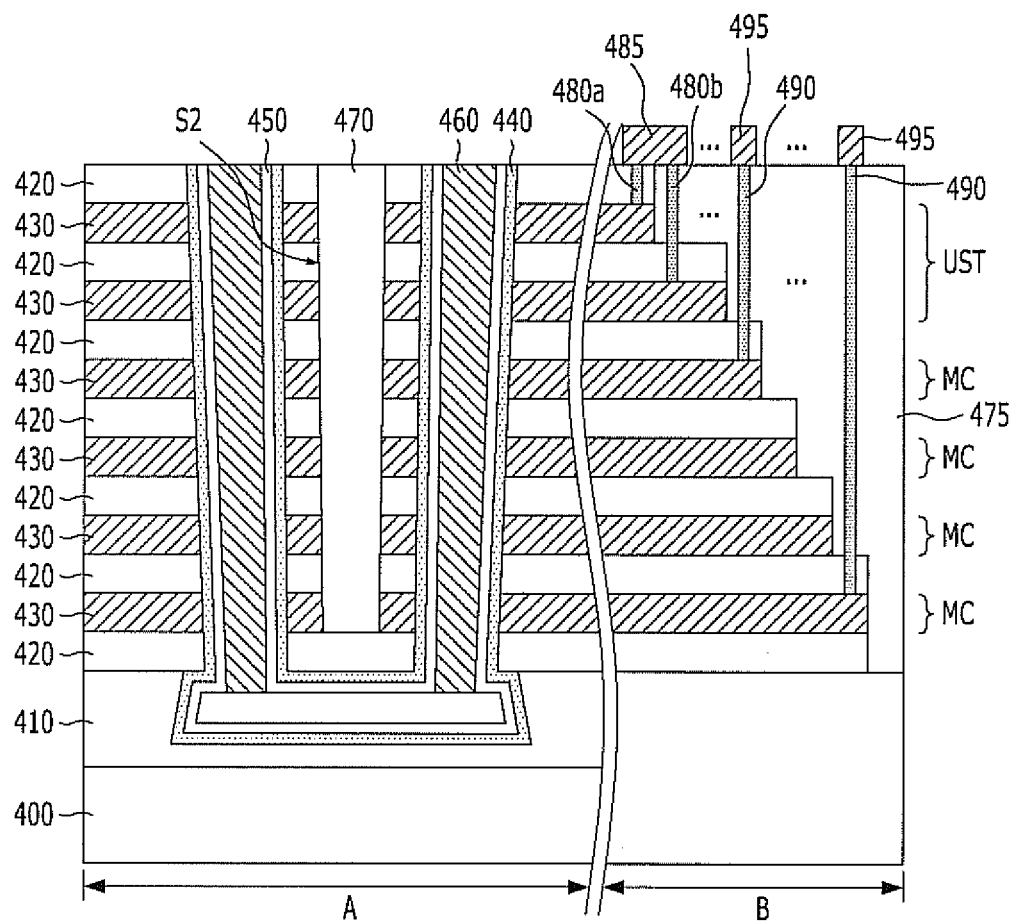

Referring to FIG. 4E, a slimming process is performed on the stacked structure of the first interlayer dielectric layers 420 and the gate electrode layers 430 in the contact formation region B such that the stacked structure of the first interlayer dielectric layers 420 and the gate electrode layers 430 has a side portion formed in a stepped shape as a whole. The slimming process has been already described above.

A second interlayer dielectric layer 475 is formed, and first and third contacts 480a, 480b, and 490 are formed to be coupled to the protruding end portions of the respective gate electrode layers 430 by passing through the second interlayer dielectric layer 475 and/or the first interlayer dielectric layers 420. More specifically, the first contacts 480a and 480b are disposed on the protruding end portions of two gate electrode layers 430 included in the upper selection transistor UST, and the third contact 490 is disposed on the protruding end portion of the gate electrode layer 430 included in each of the memory cells MC.

A first interconnection line 485 is formed on the second interlayer dielectric layer 475 so as to be coupled to both of the first contacts 480a and 480b, and a third interconnection line 495 is formed to be coupled to the third contact 490.

Through the above-described fabrication method, a nonvolatile memory device may be formed to have a structure illustrated in FIG. 4E.

In short, the nonvolatile memory device and the method for fabricating the same in accordance with the third embodiment of the present invention are substantially the same as the nonvolatile memory device and the method for fabricating the same in accordance with the first embodiment of the present invention, except that the U-shaped memory cell string is formed in the memory cell region A and thus the upper selection transistor UST is disposed only over the plurality of memory cells MC.

Therefore, in accordance with the third embodiment of the present invention, the nonvolatile memory device may have features that are the same as those of the first embodiment of the present invention.

Furthermore, although not illustrated, the nonvolatile memory device in accordance with the third embodiment of the present invention may be fabricated by using the same process as described with reference to FIGS. 3A to 3D.

For example, in FIG. 4A, the first interlayer dielectric layers 420 and sacrifice layers may be alternately stacked, instead of such a structure that the first interlayer dielectric layers 420 and the gate electrode layers 430 are alternately stacked. That is, the gate electrode layers 430 may be replaced with sacrifice layers in FIG. 4A.

The same processes as described with reference to FIGS. 4B and 4C are performed, and the slit S2 of FIG. 4D is then formed.

The sacrifice layers exposed through the slit S2 are removed, and a memory layer and a gate electrode layer may be formed in the spaces from which the sacrifice layers were removed (refer to FIG. 3D).

In accordance with the embodiments of the present invention, the nonvolatile memory device and the method for fabricating the same may satisfy desired electrical characteristics, simplify the process, and prevent errors from occurring in the process While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
    a plurality of channels protruding in a vertical direction from a substrate;
    a plurality of interlayer dielectric layers and a plurality of gate electrode layers that are alternately stacked over the substrate along the plurality of channels; and
    a plurality of memory layers formed between the plurality of channels and a stacked structure of the plurality of interlayer dielectric layers and the plurality of gate electrode layers,
    wherein two or more gate electrode layers, of the plurality of gate electrode layers, are coupled to an interconnection line to form a selection transistor, and the two or more gate electrode layers, of the selection transistor, are sequentially stacked in the vertical direction from the substrate, and
    wherein each channel, of the plurality of channels, is surrounded by the two or more gate electrode layers of the selection transistor in the vertical direction from the substrate.

2. The nonvolatile memory device of claim 1, wherein the selection transistor comprises an upper selection transistor comprising two or more gate electrode layers disposed at the top among the plurality of gate electrode layers.

3. The nonvolatile memory device of claim 2, wherein the selection transistor comprises a lower selection transistor comprising two or more gate electrode layers disposed at the bottom among the plurality of gate electrode layers.

4. The nonvolatile memory device of claim 1, wherein the two or more gate electrode layers, of the selection transistor, have a same thickness as other gate electrode layers of the plurality of the other gate electrode layers.

5. The nonvolatile memory device of claim 1, further comprising a plurality of contacts connected to each of the two or more gate electrode layers, of the selection transistor, and coupled to the interconnection line.

6. The nonvolatile memory device of claim 1, further comprising a pipe gate electrode layer disposed under the stacked structure and having a pipe channel formed therein,
    wherein each channel, of the plurality of channels, comprises a pair of first and second channels coupled to each other by the pipe channel.

7. A method for fabricating a nonvolatile memory device, the method comprising:
    alternately stacking a plurality of interlayer dielectric layers and a plurality of gate electrode layers over a substrate;
    selectively etching the plurality of interlayer dielectric layers and the plurality of gate electrode layers to form a plurality of channel holes exposing the substrate;
    forming a memory layer on a sidewall of each channel hole of the plurality of channel holes; and
    forming a channel in each channel hole of the plurality of channel holes,
    wherein two or more gate electrode layers, of the plurality of gate electrode layers, are coupled to an interconnection line to form a selection transistor, and the two or more gate electrode layers, of the selection transistor, are sequentially stacked in a vertical direction from the substrate, and
    wherein each channel, of the plurality of channels, is surrounded by the two or more gate electrode layers, of the selection transistor, in the vertical direction from the substrate.

8. The method of claim 7, wherein the selection transistor comprises:
    an upper selection transistor comprising two or more gate electrode layers disposed at the top among the plurality of gate electrode layers.

9. The method of claim 8, wherein the selection transistor comprises a lower selection transistor comprising two or more gate electrode layers disposed at the bottom among the plurality of gate electrode layers.

10. The method of claim 7, wherein the two or more gate electrode layers of the selection transistor have a same thickness as other gate electrode layers of the plurality of gate electrode layers.

11. The method of claim 7, further comprising:
    forming a plurality of contacts connected to each of the two or more gate electrode layers, of the selection transistor, and coupled to the interconnection line.

12. The method of claim 7, further comprising:
    forming a pipe gate electrode layer having a pipe channel sacrifice layer buried therein, before the forming of the plurality of interlayer dielectric layer and gate electrode layers; and
    removing the pipe channel sacrifice layer, before the forming of the memory layer,
    wherein each channel hole, of the plurality of channels holes, comprises a pair of channel holes exposing the pipe channel sacrifice layer, and
    wherein the memory layer and the channel are formed along sidewalls of the pair of channel holes and a space from which the pipe channel sacrifice layer is removed.

13. A method for fabricating a nonvolatile memory device, the method comprising:
    alternately stacking a plurality of interlayer dielectric layers and a plurality of sacrifice layers over a substrate;

selectively etching the plurality of interlayer dielectric layers and the plurality of sacrifice layers to form a plurality of channel holes exposing the substrate;

forming a channel in each channel hole of the plurality of channel holes;

forming a slit to isolate the plurality of sacrifice layers between the plurality of channel holes;

removing the plurality of sacrifice layers exposed by the slit; and forming a memory layer and gate electrode layers in spaces from which the plurality of sacrifice layers are removed, wherein two or more gate electrode layers, of the gate electrode layers, are coupled to an interconnection line to form a selection transistor, and the two or more gate electrode layers, of the selection transistor, are sequentially stacked in a vertical direction from the substrate, and wherein each channel is surrounded by the two or more gate electrode layers of the selection transistor in the vertical direction from the substrate.

14. The method of claim 13, further comprising forming a pipe gate electrode layer having a pipe channel sacrifice layer buried therein, before the forming the plurality of interlayer dielectric layers and the gate electrode layers, wherein the forming of the channel comprises:
removing the pipe channel sacrifice layer exposed by the plurality of channel holes; and
forming a memory layer and the channel along sidewalls of the plurality of channel holes and a space from which the pipe channel sacrifice layer is removed.

* * * * *